United States Patent [19]

Liang

[11] 4,328,921
[45] May 11, 1982

[54] ATTACHMENT OF SOLDER PREFORM TO A COVER FOR A SEALED CONTAINER

[75] Inventor: Shou C. Liang, Spokane, Wash.

[73] Assignee: Cominco Ltd., Vancouver, Canada

[21] Appl. No.: 155,025

[22] Filed: Jun. 2, 1980

[51] Int. Cl.³ .............................................. B23K 1/14
[52] U.S. Cl. .................... 228/222; 228/254; 228/240
[58] Field of Search ............... 228/46, 50, 222, 254, 228/240

[56] References Cited

U.S. PATENT DOCUMENTS

| | | | |
|---|---|---|---|
| 3,451,836 | 6/1969 | Spooner et al. | 228/222 X |
| 3,538,597 | 11/1970 | Leinkram | 228/254 X |
| 3,648,357 | 3/1972 | Green, Jr. | 228/254 X |
| 3,937,388 | 2/1976 | Zimmerman | 228/222 |
| 3,943,620 | 3/1976 | Sawehuk | 228/263 R |
| 3,985,283 | 10/1976 | Gempler | 228/254 X |
| 4,020,987 | 5/1977 | Hoscoe | 228/56 |

*Primary Examiner*—Gil Weidenfeld
*Assistant Examiner*—K. J. Ramsey
*Attorney, Agent, or Firm*—Neil F. Markva

[57] ABSTRACT

A method is described for attaching a preformed solder ring to a cover used to hermetically seal a container for a semiconductor device. The surface of the preformed solder ring that engages the cover is caused to melt and bond to the cover on solidification while the opposite surface of the ring is maintained relatively cool in a solid state by abutment against the flat surface of a cooling block.

13 Claims, 3 Drawing Figures

ATTACHMENT OF SOLDER PREFORM TO A COVER FOR A SEALED CONTAINER

BACKGROUND OF THE INVENTION

The present invention relates to a sealing cover for a hermetically sealed container and, more particularly, relates to a method of attaching a preformed solder ring to a cover used to hermetically seal the container of a semiconductor device.

In order to operate effectively, a semiconductor device is hermetically sealed in a container or can. Numerous means have been devised to provide this enclosure or encapsulation. One of the simplest is to assemble the device within an open top container with side walls having coplanar edges to which a flat cover having corresponding peripheral dimensions can be soldered. Solder must be provided in a form and quantity which may be melted without danger of excess solder flowing into the container and damaging the device. This may be done by stamping from sheet of desired thickness a solder ring having outer dimensions which correspond to that of the flat cover and having a width sufficient to ensure contact with the planar upper edge of the container. The preformed solder ring is usually rectangular or circular in shape. Placement of such a solder ring between the container edge and the cover followed by heating to melt the solder and cooling to solidify the solder to bond the lid to the cover is well known. However, this method requires handling and alignment of three components and rapid assembly is difficult to achieve.

Various means have been devised whereby the final assembly of a container for a semiconductor device can be reduced to handling of only two components.

In the method of U.S. Pat. No. 3,538,597, a thin coating of tin-lead eutectic solder is applied by plating or cladding to a KOVAR (Trademark of Westinghouse Electric Corp. for a cobalt-nickel-iron alloy which may contain about 17% cobalt and about 20% nickel) sheet from which covers are punched. The cover is placed on the housing and the assembly is heated to melt the solder. The solder flows into the area of contact and solidifies to bond the cover to the housing.

In the method of U.S. Pat. No. 3,579,817, a fusible alloy border is deposited onto a circuit package lid in the molten state or by such known methods as brushing, spraying or screening. A dielectric material fills the inner portion of the lid not covered by the fusible alloy border. If thicker than the fusible alloy border, the dielectric material may serve as a means to align the cover with the open frame of the circuit package.

U.S. Pat. No. 3,648,357 provides a method of hermetically sealing flat pack containers having KOVAR cans and covers, both of which are gold plated on their sealing surfaces. Relatively thick gold layers, 250 to 400 microinches or 0.25 to 0.4 mils, are applied. In addition, these coatings are each partially dissolved into an eutectic gold-tin solder preform at a temperature above the eutectic point to provide pre-tinning of the surfaces. The pre-tinned surfaces are then placed together and fused to seal the container.

U.S. Pat. No. 3,946,190, a division of U.S. Pat. No. 3,874,549 which is a division of U.S. Pat. No. 3,823,468, provides a method of fabricating a hermetic sealing cover in which a preformed solder ring is superimposed on the cover and fused to the cover at spaced points, fusion by spot welding being disclosed. Registry of the preformed solder ring with the periphery of the cover may be effected by enclosure within a shallow cavity of a nonconductive supported member. U.S. Pat. No. 3,874,549 claims a hermetic sealing cover wherein the solder ring is fused to the cover element at a plurality of spaced points.

U.S. Pat. No. 3,937,388 provides a method of sealing a pair of elements together to form a package which comprises applying a meltable sealant to a portion of one of the elements, placing one of the elements on a first heat sink and the other element on top of the first element. Heat is applied to both elements to melt the sealant and cause it to flow between the elements in a sealing relation. A second heat sink is applied to the second element to remove heat from the elements during application of heat to the sealant. Pressure is applied and heating is discontinued. Heat is removed by both heat sinks both during and after discontinuation of the heating.

STATEMENT OF THE INVENTION

I have discovered an improved method of attaching a preformed solder ring to the cover of a container for a semiconductor device to provide an assembly which permits closure of the container in an operation which requires alignment of only two components, the cover assembly and the planar upper edge of the container side walls. Basically, the method of my invention comprises attaching a preformed solder ring to a cover wherein the surface of the preformed solder ring that engages the cover is caused to melt while the opposite surface is kept in a solid state and wherein, on solidification of the molten portion of the preformed solder ring, a substantial portion of this surface is bonded to the cover.

More particularly, the method of my invention requires placement of the preformed solder ring on a flat surface of a material to which the solder does not bond. The flat surface is kept at a temperature below the melting point of the solder. The cover is placed on top of the solder ring in alignment with its periphery. Sufficient heat is applied, either by preheating the cover before alignment or by heating after placement, to raise the temperature of the upper face of the solder ring above its melting point while the flat surface remains at a temperature which ensures that the lower face of the solder ring is kept below its melting point. Solder at the upper face melts and flows into binding contact with contiguous portions of the cover while the solder at the lower face remains in the solid state. The molten portion of the solder ring is allowed to solidify and a cover assembly with a solder ring having a flat exposed face is removed from the flat surface.

Attachment of solder to a cover before soldering the cover to the container avoids problems of alignment of three separate components, i.e. cover, preformed solder ring and container, during closure of the container. Known methods of providing a two component system include plating of the whole cover with solder and causing the solder to flow into areas of contact, application of molten solder to cover borders defined by central placement of dielectric material, and pretinning of both cover and container edges with solder. These methods tend to use excessive quantities of solder with accompanying danger of contamination of the semiconductor devices as well as unnecessary expense, particularly when the solder is eutectic gold-tin alloy.

With complete melting of the solder ring, surface tension causes the solder to form in a mound. Such a cover assembly is difficult to place onto a container precisely, as there is a tendency for the cover assembly to tilt as the curved solder face is brought into contact with the container edge. Failure to achieve hermetic sealing results. The method of the present invention provides more extensive adhesion of the solder than spot welding at a plurality of points. Incomplete melting through the thickness of the solder ring provides the cover assembly with a substantially flat solder face which is easier to bring into full contact with the container edge.

DESCRIPTION OF THE PREFERRED EMBODIMENT

Figure 1:
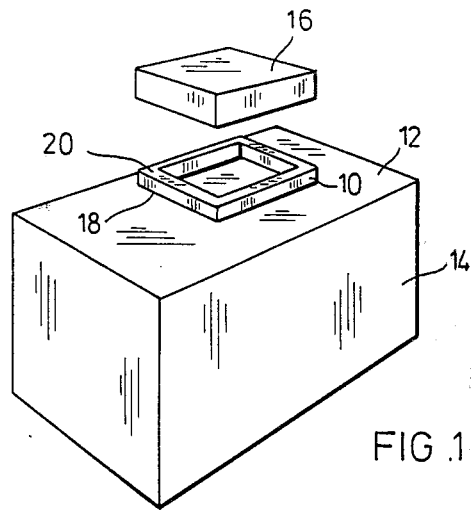
FIG. 1 is a perspective view showing placement of a preformed solder ring on a flat surface of a cooling block and a heated cover ready for placement on the solder ring.

FIG. 1 illustrates a modification of the process of the invention wherein preformed solder ring 10 is placed on flat surface 12 of cooling block 14 formed from material to which the solder does not bond such as aluminum, ceramics or graphite. Container cover 16 which has been heated, e.g., on a block (not shown) which is similar to block 14, is ready to be placed on top of solder ring 10, with its peripheral edges aligned with those of the ring. Cooling block 14 is maintained at a temperature which keeps lower face 18 of solder ring 10 below the melting point of the solder. Cover 16 is preheated to a temperature which is sufficiently above the melting point of the solder to cause, on contact with solder ring 10, melting of a substantial portion of upper face 20. The molten solder flows into binding contact with contiguous portions of cover 16.

Figure 3:
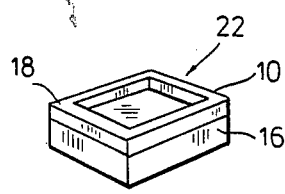
FIG. 3 is a perspective view of an inverted cover assembly having the solder ring bonded to the cover.

On cooling and solidification of the solder, cover assembly 22, FIG. 3, comprising cover 16 and bonded solder ring 10 is removed from cooling block 14. In an example, solder ring 10 was stamped from a 2 mil thick sheet of eutectic gold-tin alloy which has a 280° C. melting point. An aluminum cooling block 14 was kept below 200° C., and cover 16, comprising gold plated cobalt-nickel-iron (KOVAR) alloy and having a thickness of 10 mils, was preheated to about 350° C. Preformed solder ring 10 was placed on smooth flat surface 12 of cooling block 14 and preheated cover 16 was placed on solder ring 10 with corresponding edges aligned. Within a few seconds substantially all of upper surface 20 of the solder ring melted and molten alloy flowed into effective tinning contact with contiguous portions of the gold plated cover. Even though the solder ring was only 2 mils thick, substantially no melting of lower face 18 occurred and there was no tendency for the solder to stick to cooling block 14 when assembly 22 was removed.

In another example, cooling block 14 was maintained at room temperature while other operating conditions were as stated above. About 25% of surface 20 of the solder ring bonded to container lid 16. The percentage of the length of the solder ring that is bonded to the cover is visually observable and can be tested by pressing a pointed object between the solder and the cover. Attachment that is effective to keep the cover and solder together until the assembly is attached to a container in a later operation is achieved by bonding as little as 2 percent of the length of the ring to the cover. Substantially more bonded surface is provided than by fusing the solder ring at a reasonable number of spaced points by the method of U.S. Pat. No. 3,874,549. Nearly the total length of the ring can be bonded without causing the shape of the ring to change to form a surface tension mound or causing solder to flow away from the area which is to be aligned with the container edge.

A cooling block on which an eutectic gold-tin alloy solder ring is placed may be maintained at any temperature that is lower than the 280° C. melting point of the alloy. A temperature below 200° C. is preferred. The gold plated cobalt-nickel-iron alloy or KOVAR must be heated to at least 315° C. in order to obtain a bond. Damage of the gold plating is avoided if the cover is not heated above 550° C. Therefore, a temperature range between 315° C. and 550° C. is critical for gold plated KOVAR lids. A higher temperature gives more manipulation time while a lower temperature avoids disadvantages that could result from excessive heating. In a preferred operation, cover 16 is placed on a block which is kept at a temperature between 315° and 550° C. The cover is then picked up and put onto solder ring 10 which is on cooling block 14. Mechanical alignment of the cover and the ring is provided during placement. A solder ring width of 0.5 to 1.0 mm is convenient.

Figure 2:
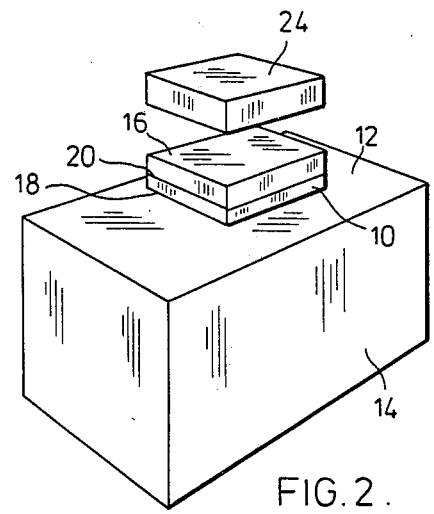
FIG. 2 is a perspective view showing placement of a preformed solder ring on a flat surface of a cooling block, an unheated cover in aligned position thereon and a heating mass ready for placement on top of the cover.

FIG. 2 illustrates another modification of the invention wherein preformed solder ring 10 is placed on flat surface 12 of cooling block 14 and cover 16 is placed on top of solder ring 10 with their corresponding edges aligned. Solder ring 10 and cover 16, initially at ambient or room temperature, are allowed to come to the temperature of the cooling block which is maintained at a temperature that is sufficiently below the melting point of the solder to keep lower face 18 of solder ring 10 below the melting point of the solder as adequate heat is applied to cover 16 to melt a substantial portion of upper face 20 of the solder ring. Cover 16 may be heated in any convenient manner, e.g., heating block 24 may be lowered onto cover 16. As before, molten solder at upper face 20 of ring 10 flows into binding contact with contiguous portions of cover 16 to provide, on cooling, cover assembly 22. In an example of this modification, an eutectic gold-tin alloy solder ring 10, initially at room temperature, was placed on aluminum cooling block 14 which was maintained at about 100° C. and a gold plated KOVAR cover 16, also at room temperature, was placed on solder ring 10 with their corresponding edges aligned. Heating block 24, preheated to 350°–450° C., was lowered onto cover 16. Within a few seconds a substantial portion of upper face 20 of the solder ring melted and flowed into binding contact with contiguous portions of the gold plated KOVAR cover. Lower face 18 remained in the solid state. On dissipation of sufficient heat from block 24 to get interface temperatures below the melting point of the solder, block 24 and cover assembly 22 were removed from cooling block 14. About 60% of surface 20 of the solder ring bonded to container lid 16.

Maintenance of the lower face 18 of solder ring 10 below the melting point of the solder alloy assures retention of the shape of the ring during attachment to the cover. Molten solder does not flow laterally beyond the boundaries of the preformed ring to risk contamination of a semiconductor device which is enclosed within a container to which the cover is attached. The area of bonded contact between the solder ring and the cover is substantially greater than the area of bonded contact which can be conveniently obtained by spot welding at a plurality of points. No sophisticated equipment is required and rapid, low cost bonding of solder to container covers is achieved.

Although the foregoing description relates primarily to the attachment of eutectic gold-tin alloy solder to gold plated KOVAR covers, the same method is applicable to the attachment of other solders to other cover materials. The solder ring is placed on a block which is maintained at a temperature below the melting point of the ring, while the cover is heated to a temperature that is high enough to get a bond yet low enough to avoid undesirable temperature effects such as injury to plating on the cover. For attachment of a lead-indium-silver alloy solder ring containing about 5% indium and about 2.5% silver and having a melting point of about 305° C. to a gold plated KOVAR cover, the cover should be heated to at least 350° C. and not above 550° C. An unplated KOVAR cover may be heated to 600° C. without damage.

Cobalt-nickel-iron alloy (KOVAR) covers are used principally because the alloy has a low coefficient of expansion. Iron-nickel alloy containing about 42 percent nickel, known as "alloy 42" either unplated or plated with gold or nickel, is also a suitable cover material. Eutectic Pb-Sn alloy with a melting point of 183° C. is also a suitable solder material. In each case, the preformed solder ring is placed on a block of non-adhering material that is kept at a temperature below the melting point of the solder while the cover is heated to a temperature that is above the melting point of the solder by an amount that is sufficient to provide a bond that remains effective through packaging and shipping of cover assemblies for later use in closing containers enclosing semiconductor devices.

It will be understood of course that modifications can be made in the embodiment of the invention illustrated and described herein without departing from the scope and purview of the invention as defined by the appended claims.

What we claim as new and desire to protect by Letters Patent of the United States is:

1. A method of attaching a preformed solder ring to a cover of a container which method comprises placing said solder ring on a flat surface of a cooling block formed of a material to which the solder does not bond, placing said cover on top of said solder ring with alignment of respective peripheral edges, heating said cover to a temperature above the melting point of the solder while maintaining said cooling block at a temperature below the melting point of the solder wherein a substantial portion of the upper face of the solder ring melts while said cooling block keeps the temperature of the lower face of the solder ring below the melting point of the solder, said molten solder flowing into binding contact with contiguous portions of said cover, and cooling said solder ring to solidify said molten solder, thereby providing a cover assembly comprising said cover with said solder ring attached.

2. A method as claimed in claim 1 wherein said cover is preheated to a temperature above the melting point of said solder and then placed on top of said solder ring to melt a substantial portion of the upper face of the solder ring, and wherein said molten solder solidifies as the temperature of said cover falls to the melting point of the solder to bind the solder ring to the cover.

3. A method as claimed in claim 1 wherein said cover is at ambient temperature when placed on top of said solder ring and heating means is then applied to said cover to heat said cover to a temperature above the melting point of said solder and the solder at said upper face melts, and wherein said molten solder solidifies as said heating means is removed from said cover and the temperature of said cover falls to the melting point of the solder to bind the solder ring to the cover.

4. A method as claimed in claim 1 wherein said cover is at ambient temperature when placed on top of said solder ring and heating means is applied to said cover to heat said cover to a temperature above the melting point of said solder and solder at said upper face melts, and wherein said molten solder solidifies as excess heat in said heating means dissipates and the temperature of said cover falls to the melting point of the solder.

5. A method as claimed in claim 2, 3 or 4, wherein said solder ring is a gold-tin alloy having a 280° C. melting point and said cover is a gold plated cobalt-nickel-iron alloy.

6. A method as claimed in claim 2, 3 or 4, wherein said solder ring is a gold-tin alloy having a 280° C. melting point and said cover is a gold-plated cobalt-nickel-iron alloy, said cooling block is maintained between ambient temperature and a temperature below 280° C., and said cover is heated to a temperature between 315° C. and 550° C.

7. A method as claimed in claim 2, 3 or 4, wherein said solder ring is a lead-indium-silver alloy containing about 5 percent indium and about 2.5 percent silver having a melting point of about 305° C. and said cover is a gold plated cobalt-nickel-iron alloy.

8. A method as claimed in claim 2, 3 or 4, wherein said solder ring is a lead-indium-silver alloy containing about 5 percent indium and about 2.5 percent silver having a melting point of about 305° C. and said cover is a gold plated cobalt-nickel-iron alloy, said cooling block is maintained between ambient temperature and a temperature below 280° C., and said cover is heated to a temperature between 350° C. and 550° C.

9. A method as claimed in claim 2, 3 or 4, wherein said solder ring is a lead-indium-silver alloy containing about 5 percent indium and about 2.5 percent silver having a melting point of about 305° C. and said cover is an unplated cobalt-nickel-iron alloy.

10. A method as claimed in claim 2, 3 or 4, wherein said solder ring is a lead-indium-silver alloy containing about 5 percent indium and about 2.5 percent silver having a melting point of about 305° C. and said cover is an unplated cobalt-nickel-iron alloy, said cooling block is maintained between ambient temperature and a temperature below 280° C., and said cover is heated to a temperature between 350° C. and 600° C.

11. A method as claimed in claim 2, 3 or 4, wherein said cover is an unplated iron-nickel alloy.

12. A method as claimed in claim 2, 3 or 4, wherein said cover is a gold plated iron-nickel alloy.

13. A method as claimed in claim 2, 3 or 4, wherein said cover is a nickel plated iron-nickel alloy.

* * * * *